US011600633B2

(12) United States Patent
Wu et al.

(10) Patent No.: US 11,600,633 B2
(45) Date of Patent: Mar. 7, 2023

(54) LOCAL CONTACTS OF THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Jianzhong Wu, Wuhan (CN); Kun Zhang, Wuhan (CN); Tingting Zhao, Wuhan (CN); Rui Su, Wuhan (CN); Zhongwang Sun, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 16/862,368

(22) Filed: Apr. 29, 2020

(65) Prior Publication Data
US 2021/0225863 A1 Jul. 22, 2021

Related U.S. Application Data

(63) Continuation of application No. PCT/CN2020/073107, filed on Jan. 20, 2020.

(51) Int. Cl.
*H01L 27/115* (2017.01)
*H01L 27/11582* (2017.01)
(Continued)

(52) U.S. Cl.
CPC .... *H01L 27/11582* (2013.01); *H01L 21/7684* (2013.01); *H01L 21/76805* (2013.01);
(Continued)

(58) Field of Classification Search
CPC ......... H01L 27/11582; H01L 27/11556; H01L 27/11565; H01L 27/1157; H01L 27/11573
See application file for complete search history.

(56) References Cited

U.S. PATENT DOCUMENTS

| 9,524,981 B2 | 12/2016 | Pachamuthu et al. |
| 2016/0204122 A1 | 7/2016 | Shoji et al. |

(Continued)

FOREIGN PATENT DOCUMENTS

| CN | 106847820 A | 6/2017 |
| CN | 108807410 A | 11/2018 |

(Continued)

OTHER PUBLICATIONS

WO2018038786 (Year: 2017).*

(Continued)

*Primary Examiner* — Tony Tran
(74) *Attorney, Agent, or Firm* — Bayes PLLS

(57) ABSTRACT

Embodiments of 3D memory devices and methods for forming the same are disclosed. In an example, a 3D memory device includes a substrate, a memory stack, a channel structure, a channel local contact, and a slit structure. The memory stack includes interleaved conductive layers and dielectric layers above the substrate. The channel structure extends vertically through the memory stack. The channel local contact is above and in contact with the channel structure. The slit structure extends vertically through the memory stack. The slit structure includes a contact including a first contact portion and a second contact portion above the first contact portion and having a different material of the first contact portion. An upper end of the second contact portion of the slit structure is flush with an upper end of the channel local contact.

12 Claims, 12 Drawing Sheets

(51) Int. Cl.
*H01L 21/768* (2006.01)
*H01L 23/535* (2006.01)
*H01L 27/11524* (2017.01)
*H01L 27/11556* (2017.01)
*H01L 27/1157* (2017.01)

(52) U.S. Cl.
CPC .. *H01L 21/76831* (2013.01); *H01L 21/76895* (2013.01); *H01L 23/535* (2013.01); *H01L 27/1157* (2013.01); *H01L 27/11524* (2013.01); *H01L 27/11556* (2013.01); *H01L 2221/1063* (2013.01)

(56) References Cited

U.S. PATENT DOCUMENTS

| | | |
|---|---|---|
| 2016/0329343 A1 | 11/2016 | Pachamuthu et al. |
| 2017/0148800 A1 | 5/2017 | Nishikawa et al. |
| 2019/0333929 A1* | 10/2019 | Lee .................. H01L 27/11565 |
| 2019/0355746 A1 | 11/2019 | Barbato |
| 2019/0363100 A1* | 11/2019 | Lee ..................... H01L 23/528 |

FOREIGN PATENT DOCUMENTS

| | | |
|---|---|---|
| CN | 109314118 A | 2/2019 |
| CN | 109727908 A | 5/2019 |
| CN | 110520985 A | 11/2019 |
| TW | 201841347 A | 11/2018 |
| TW | 201909386 A | 3/2019 |
| WO | 2018/038786 A1 | 3/2018 |

OTHER PUBLICATIONS

International Search Report issued in corresponding International Application No. PCT/CN2020/073107, dated Oct. 27, 2020, 4 pages.
Extended European Search Report issued in corresponding European Application No. 20915213.1, dated Nov. 23, 2022, 11 pages.

* cited by examiner

100

LOCAL CONTACTS OF THREE-DIMENSIONAL MEMORY DEVICES AND METHODS FOR FORMING THE SAME

CROSS-REFERENCE TO RELATED APPLICATIONS

This application is continuation of International Application No. PCT/CN2020/073107, filed on Jan. 20, 2020, entitled "LOCAL CONTACTS OF THREE-DIMENSIONAL MEMORY DEVICES AND METHODS FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a substrate, a memory stack, a channel structure, a channel local contact, and a slit structure. The memory stack includes interleaved conductive layers and dielectric layers above the substrate. The channel structure extends vertically through the memory stack. The channel local contact is above and in contact with the channel structure. The slit structure extends vertically through the memory stack. The slit structure includes a contact including a first contact portion and a second contact portion above the first contact portion and having a different material of the first contact portion. An upper end of the second contact portion of the slit structure is flush with an upper end of the channel local contact.

In another example, a 3D memory device includes a substrate, a memory stack, a channel structure, a channel local contact, and a slit structure. The memory stack includes interleaved conductive layers and dielectric layers above the substrate. The channel structure extends vertically through the memory stack. The channel local contact is above and in contact with the channel structure. The slit structure extends vertically through the memory stack. The slit structure includes a spacer and a contact including a first contact portion and a second contact portion above the first contact portion and having a different material of the first contact portion. A diameter of an upper end of the second contact portion is greater than a diameter of an upper end of the first contact portion and is not greater than an outer diameter of the spacer.

In still another example, a method for forming a 3D memory device is disclosed. A channel structure extending vertically through a dielectric stack including interleaved sacrificial layers and dielectric layers above a substrate is formed. A sacrificial plug above and in contact with the channel structure is formed. A slit opening extending vertically through the dielectric stack is formed. A memory stack including interleaved conductive layers and the dielectric layers is formed by replacing, through the slit opening, the sacrificial layers with the conductive layers. A first contact portion is formed in the slit opening. The sacrificial plug is removed after forming the first contact portion to expose the channel structure. A channel local contact above and in contact with the channel structure, and a second contact portion above the first contact portion in the slit opening are simultaneously formed.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
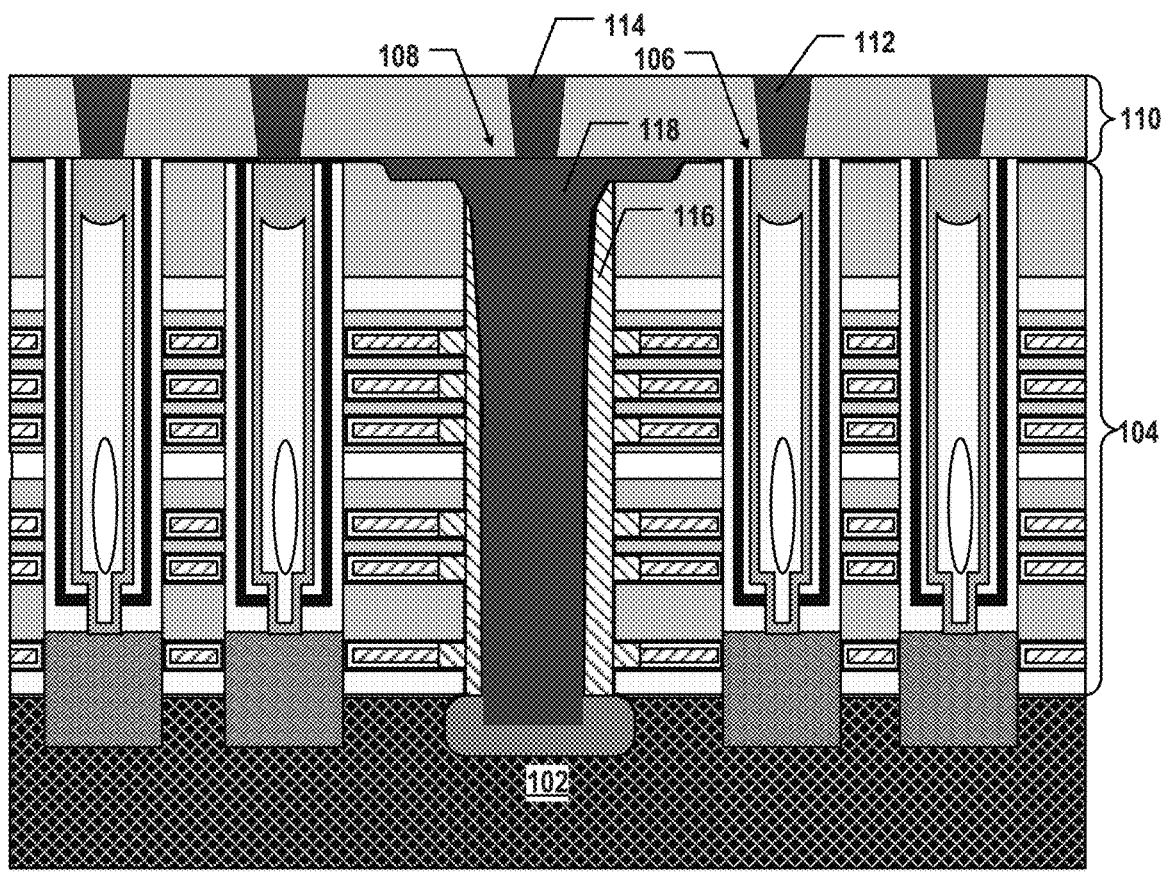
FIG. 1 illustrates a cross-section of a 3D memory device.
Figure 1:
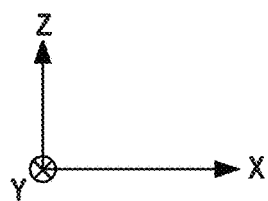

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a slit structure is used for various functions including separating the memory array into multiple blocks, providing access for the etchant and chemical precursor during a gate replacement process, and providing an electrical connection to the source of the memory array. FIG. 1 illustrates a cross-section of a 3D memory device 100. As illustrated in FIG. 1, 3D memory device 100 includes a memory stack 104 above a substrate 102. 3D memory device 100 also includes an array of channel structures 106 and a slit structure 108 each extending vertically through memory stack 104. In a NAND Flash memory device, each channel structure 106 functions as a NAND memory string, and slit structure 108 functions as an electrical connection to the source of the NAND memory strings, for example, an array common source (ACS) of an array of channel structures 106. Slit structure 108 includes a source contact 118 surrounded by a spacer 116.

3D memory device 100 further includes an interconnect structure for channel structure 106 and slit structure 108 above memory stack 104, which includes a local contact layer 110 on memory stack 104. It is noted that x-, y-, and z-axes are included in FIG. 1 to illustrate the spatial relationships of the components in 3D memory device 100. Substrate 102 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the z-direction (the vertical direction perpendicular to the x-y plane) when the substrate is positioned in the lowest plane of the semiconductor device in the z-direction. The same notion for describing spatial relationships is applied throughout the present disclosure.

Local contact layer 110 includes local contacts (also known as "C1") that are in contact with a structure in memory stack 104 directly, including channel local contacts 112 in contact with channel structures 106, respectively, and a slit local contact 114 in contact with slit structure 108. In forming 3D memory device 100, slit structure 108 is formed prior to the formation of the local contacts (e.g., channel local contacts 112). As a result, the upper ends of channel structure 106 and slit structure 108 are flush with one another, and slit local contact 114 is necessary for interconnecting slit structure 108, as shown in FIG. 1. However, the local stress of the wafer becomes worse after the gate replacement process and process for forming slit structure 108, which makes the overlay between each channel local contact 112 and a respective channel structure 106 more challenging, in particular, as the level of 3D memory device 100 keeps increasing. For example, the wafer local stress may increase the occurrence of misalignment between the contact holes of channel local contacts 112 and the upper ends of channel structure 106 when the contact holes are etched after the gate replacement and formation of slit structure 108.

Moreover, as shown in FIG. 1, the upper end of source contact 118 of slit structure 108 has a "dishing" profile which makes the deposition of various materials into the slit opening in forming slit structure easier but is undesirable in the final stage of 3D memory device 100 after fabrication. However, as different materials (e.g., polysilicon and tungsten) are formed at the upper ends of channel structures 106 and source contact 118, respectively, it is difficult to trim the "dishing" profile at the upper end of source contact 118 by a planarization process, such as chemical mechanical polishing (CMP). Due to the "dishing" profile, the upper end of source contact 118 exceeds the boundary of spacer 116 in the plan view. For example, as shown in FIG. 1, the diameter of the upper end of source contact 118 is greater than the outer diameter of spacer 116 in the x-direction.

Various embodiments in accordance with the present disclosure provide 3D memory devices with improved local contact structure and fabrication process. By moving the step of etching the contact holes of channel local contacts earlier in the fabrication processes (i.e., before the gate replacement and slit structure formation processes), the wafer local stress can be reduced, which in turn reduces the complexity of overlay control. The modification of the fabrication process can also skip the formation of slit local contacts, thereby further reducing the challenge of overlay control. In some embodiments, the same conductive materials (e.g., tungsten) for forming the channel local contacts and slit structure can be deposited in the same process to reduce the fabrication cost. Moreover, by merging the contact deposition processes for channel local contacts and slit structure with the same conductive materials (e.g., tungsten), the planarization process (e.g., CMP) can be improved with more patterns of the same material to trim the "dishing" profile at the top portion of the slit structure.

Figure 2:
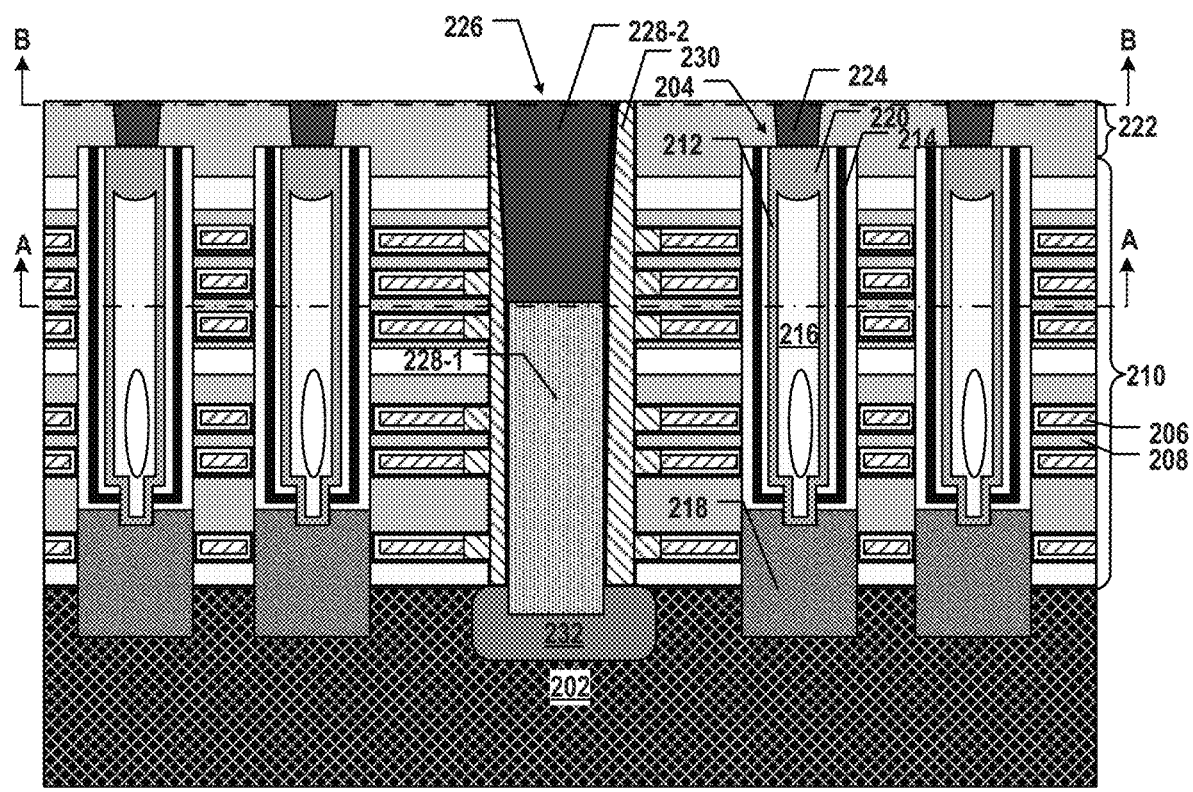
FIG. 2 illustrates a cross-section of an exemplary 3D memory device, according to some embodiments of the present disclosure.
Figure 2:
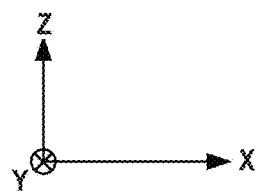

FIG. 2 illustrates a cross-section of an exemplary 3D memory device 200, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, etching, CMP, or any combination thereof.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 200 is a NAND Flash memory device in which memory cells are provided in the form of an array of NAND memory strings each extending vertically above substrate 202. The memory array device can include an array of channel structures 204 functioning as the array of NAND memory strings. As shown in FIG. 2, channel structure 204 can extend vertically through a plurality of pairs each including a conductive layer 206 and a dielectric layer 208. The interleaved conductive layers 206 and dielectric layers 208 are part of a memory stack 210. The number of the pairs of conductive layers 206 and dielectric layers 208 in memory stack 210 (e.g., 32, 64, 96, or 128) determines the number of memory cells in 3D memory device 200. It is understood that in some embodiments, memory stack 210 may have a multi-deck architecture, which includes a plurality of memory decks stacked over one another. The numbers of the pairs of conductive layers 206 and dielectric layers 208 in each memory deck can be the same or different.

Memory stack 210 can include a plurality of interleaved conductive layers 206 and dielectric layers 208. Conductive layers 206 and dielectric layers 208 in memory stack 210 can alternate in the vertical direction. In other words, except the ones at the top or bottom of memory stack 210, each conductive layer 206 can be adjoined by two dielectric layers 208 on both sides, and each dielectric layer 208 can be adjoined by two conductive layers 206 on both sides. Conductive layers 206 can include conductive materials including, but not limited to, tungsten (W), cobalt (Co), copper (Cu), aluminum (Al), polysilicon, doped silicon, silicides, or any combination thereof. Each conductive layer 206 can be a gate electrode (gate line) surrounding channel structure 204 and can extend laterally as a word line. Dielectric layers 208 can include dielectric materials including, but not limited to, silicon oxide, silicon nitride, silicon oxynitride, or any combination thereof.

As shown in FIG. 2, channel structure 204 can include a channel hole filled with a semiconductor layer (e.g., as a semiconductor channel 212) and a composite dielectric layer (e.g., as a memory film 214). In some embodiments, semiconductor channel 212 includes silicon, such as amorphous silicon, polysilicon, or single-crystal silicon. In some embodiments, memory film 214 is a composite layer including a tunneling layer, a storage layer (also known as a "charge trap layer"), and a blocking layer. The remaining space of channel structure 204 can be partially or fully filled with a capping layer 216 including dielectric materials, such as silicon oxide, and/or an air gap. Channel structure 204 can have a cylinder shape (e.g., a pillar shape). Capping layer 216, semiconductor channel 212, the tunneling layer, storage layer, and blocking layer of memory film 214 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, memory film 214 can include a composite layer of silicon oxide/silicon oxynitride/silicon oxide (ONO).

In some embodiments, channel structure 204 further includes a semiconductor plug 218 in the bottom portion (e.g., at the lower end) of channel structure 204. As used herein, the "upper end" of a component (e.g., channel structure 204) is the end farther away from substrate 202 in the y-direction, and the "lower end" of the component (e.g., channel structure 204) is the end closer to substrate 202 in the y-direction when substrate 202 is positioned in the lowest plane of 3D memory device 200. Semiconductor plug 218 can include a semiconductor material, such as silicon, which is epitaxially grown from substrate 202 in any suitable directions. It is understood that in some embodiments, semiconductor plug 218 includes single-crystal silicon, the same material of substrate 202. In other words, semiconductor plug 218 can include an epitaxially-grown semiconductor layer that is the same material as substrate 202. Semiconductor plug 218 can be below and in contact with the lower end of semiconductor channel 212. Semiconductor plug 218 can function as a channel controlled by a source select gate of the NAND memory string.

In some embodiments, channel structure 204 further includes a channel plug 220 in the top portion (e.g., at the upper end) of channel structure 204. Channel plug 220 can be above and in contact with the upper end of semiconductor channel 212. Channel plug 220 can include semiconductor materials (e.g., polysilicon). By covering the upper end of channel structure 204 during the fabrication of 3D memory device 200, channel plug 220 can function as an etch stop layer to prevent etching of dielectrics filled in channel structure 204, such as silicon oxide and silicon nitride. In some embodiments, channel plug 220 can function as the drain of the NAND memory string.

As shown in FIG. 2, 3D memory device 200 also includes a local contact layer 222 on memory stack 210. In some embodiments, local contact layer 222 is formed on top of the upper end of channel structure 204 (i.e., channel plug 220). Local contact layer 222 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. The interconnects in local contact layer 222 are referred to herein as "local contacts" (also known as "C1"), which are in contact with a structure in memory stack 210 directly. In some embodiments, local contact layer 222 includes a channel local contact 224 above and in contact with the upper end of channel structure 204 (e.g., channel plug 220).

Local contact layer 222 can further include one or more interlayer dielectric (ILD) layers (also known as "intermetal dielectric (IMD) layers") in which the local contacts (e.g., channel local contact 224) can form. In some embodiments, local contact layer 222 includes channel local contact 224 in one or more local dielectric layers. Channel local contact 224 in local contact layer 222 can include conductive materials including, but not limited to, Cu, Al, W, Co, silicides, or any combination thereof. In one example, channel local contact 224 is made of tungsten. The ILD layers in local contact layer 222 can include dielectric materials including, but not limited to, silicon oxide, silicon nitride, silicon oxynitride, low dielectric constant (low-k) dielectrics, or any combination thereof.

As shown in FIG. 2, 3D memory device 200 further includes a slit structure 226 extending vertically through local contact layer 222 and interleaved conductive layers 206 and dielectric layers 208 of memory stack 210. Slit structure 226 can also extend laterally (e.g., in the bit line direction/y-direction in FIG. 2) to separate memory stack 210 into multiple blocks. Slit structure 226 can include a slit opening that provides access for the chemical precursor to form conductive layers 206. In some embodiments, slit structure 226 also includes a doped region 232 at its lower end in substrate 202 to reduce the resistance of the electrical connection with the ACS.

In some embodiments, slit structure 226 further includes a contact 228 functioning as the source contact for electrically connecting the ACS of the NAND memory strings to the interconnect structures, such as source lines (not shown). As shown in FIG. 2, contact 228 can include a lower contact portion 228-1 in the bottom portion of slit structure 226 (e.g., in contact with doped region 232) and an upper contact portion 228-2 in the top portion of slit structure 226. In some embodiments, upper contact portion 228-2 is above and in contact with lower contact portion 228-1 and has a different material of lower contact portion 228-1. Lower contact portion 228-1 can include a conductive material, such as doped polysilicon to reduce the contact resistance with doped region 232. Upper contact portion 228-2 can include conductive materials, such as a metal including, but not limited to, W, Co, Cu, Al, or any combination thereof. In one example, upper contact portion 228-2 may include tungsten. As described below in detail, as the conductive materials of channel local contacts 224 and upper contact portion 228-2 of slit structure 226 can be deposited in the same process, upper contact portion 228-2 and channel local contacts 224 include the same conductive material, such as the same metal. In one example, the metal may include tungsten.

Different from slit structure 108 of 3D memory device 100 in FIG. 1, which has its upper end flush with the upper end of channel structure 106 below local contact layer 110, slit structure 226 of 3D memory device 200 in FIG. 2 has its upper end above the upper end of channel structure 204. That is, slit structure 226 can extend vertically further through local contact layer 222. As a result, local contact layer 222 does not include a slit local contact above and in contact with the upper end of slit structure 226, which is different from local contact layer 110 in FIG. 1 that includes slit local contact 114 of slit structure 108. As shown in FIG. 2, the upper end of upper contact portion 228-2 of slit structure 226 is flush with the upper end of channel local contact 224, according to some embodiments. By replacing the slit local contact with a continues, trench-like interconnect (e.g., contact 228 of slit structure 226), the overlay control for the local contacts in local contact layer 222 can be simplified, and the resistance of the interconnect structure can be reduced.

To electrically insulate contact 228 of slit structure 226 from conductive layers 206 of memory stack 210, slit structure 226 can further include a spacer 230 disposed along the sidewall of the slit opening and in etch-back recesses abutting the sidewall of the slit opening. That is, spacer 230 can be formed laterally between contact 228 and conductive layers 206 of memory stack 210. Spacer 230 can include one or more layers of dielectric materials, such as silicon oxide, silicon nitride, silicon oxynitride, or any combination thereof. As shown in FIG. 2, spacer 230 can extend laterally (e.g., in the bit line direction/y-direction in FIG. 2) and have a certain thickness along the sidewall of the slit opening in the word line direction/x-direction. That is, spacer 230 can have an outer diameter and an inner diameter in the word line direction/x-direction in FIG. 2.

Different from slit structure 108 of 3D memory device 100 in FIG. 1, which has a "dishing" profile at the upper end of source contact 118 thereof, the "dishing" profile at the upper end of upper contact portion 228-2 of slit structure 226 of 3D memory device 200 in FIG. 2 can be trimmed, i.e., reduced or even removed. In some embodiments, as shown in FIG. 2, the diameter of the upper end of upper contact portion 228-2 is not greater than the outer diameter of spacer 230 in the word line direction/x-direction. That is, the upper end of upper contact portion 228-2 does not exceed the boundary of spacer 230 in a plan view, according to some embodiments, because the part of upper contact portion 228-2 that exceeds the boundary of spacer 230 can be relatively easily removed by a planarization process (e.g., CMP) due to the improved local contact patterns as described below in detail.

Figure 3A:
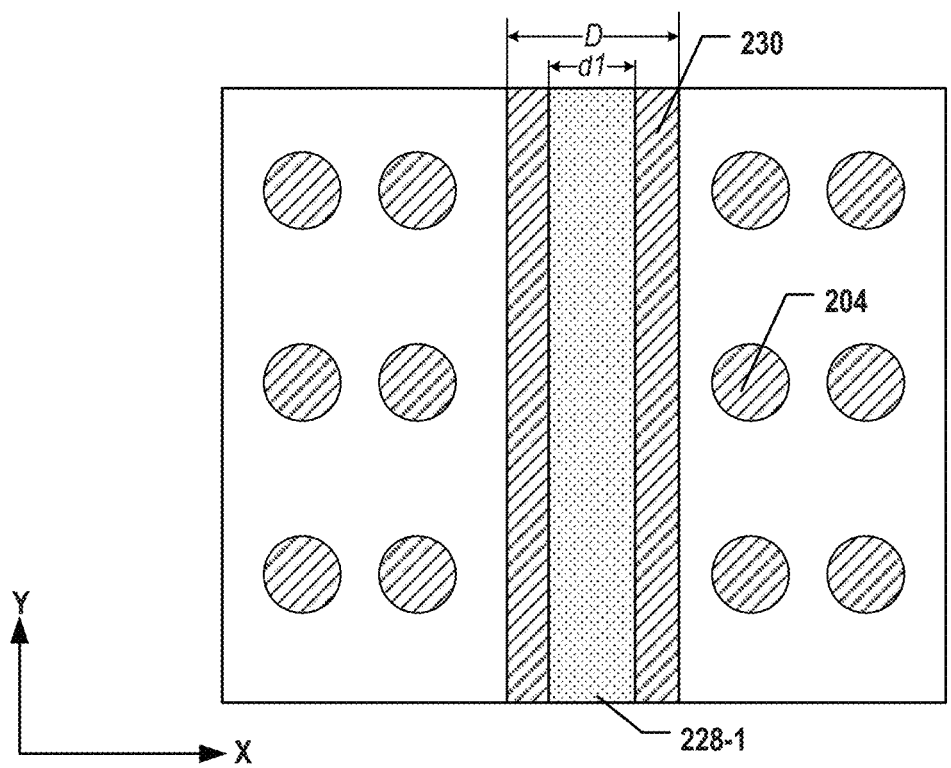
FIGS. 3A and 3B illustrate plan views of the exemplary 3D memory device in FIG. 2, according to some embodiments of the present disclosure.
Figure 3B:
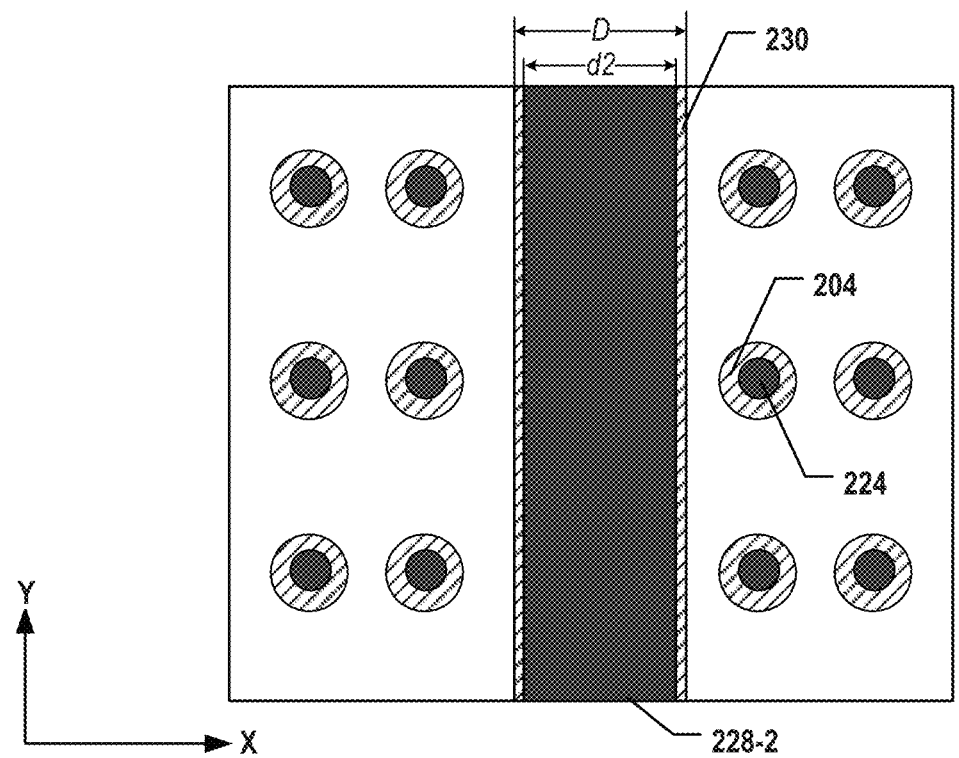

For example, FIGS. 3A and 3B illustrate plan views of exemplary 3D memory device 200 in FIG. 2, according to some embodiments of the present disclosure. FIG. 3A shows the plan view of a cross-section in the A-A direction through the upper end of lower contact portion 228-1 of slit structure 226 in FIG. 2, and FIG. 3B shows the plan view of another cross-section in the B-B direction through the upper end of upper contact portion 228-2 of slit structure 226 in FIG. 2. As shown in FIG. 3B, the upper end of upper contact portion 228-2 does not exceed the boundary of spacer 230 in the plan view. That is, the diameter d2 of the upper end of upper contact portion 228-2 is not greater than the outer diameter D of spacer 230 in the word line direction/x-direction, according to some embodiments. The diameter d2 can be smaller than or the same as the diameter D. As further shown in FIG. 3B, the diameter d2 of the upper end of upper contact portion 228-2 is greater than the diameter d1 of the upper end of lower contact portion 228-1 in the word line direction/x-direction, according to some embodiments. In some embodiments, the diameter d2 of the upper end of upper contact portion 228-2 is greater than the diameter of channel local contacts 224, as shown in FIG. 3B.

It is understood that additional interconnect structures besides local contact layer 222 in 3D memory device 200 are not shown in FIG. 2, which can be formed to provide desired interconnect structures of 3D memory device 200 for transferring electrical signals from and to channel structures 204 and slit structure 226.

Figure 4A:
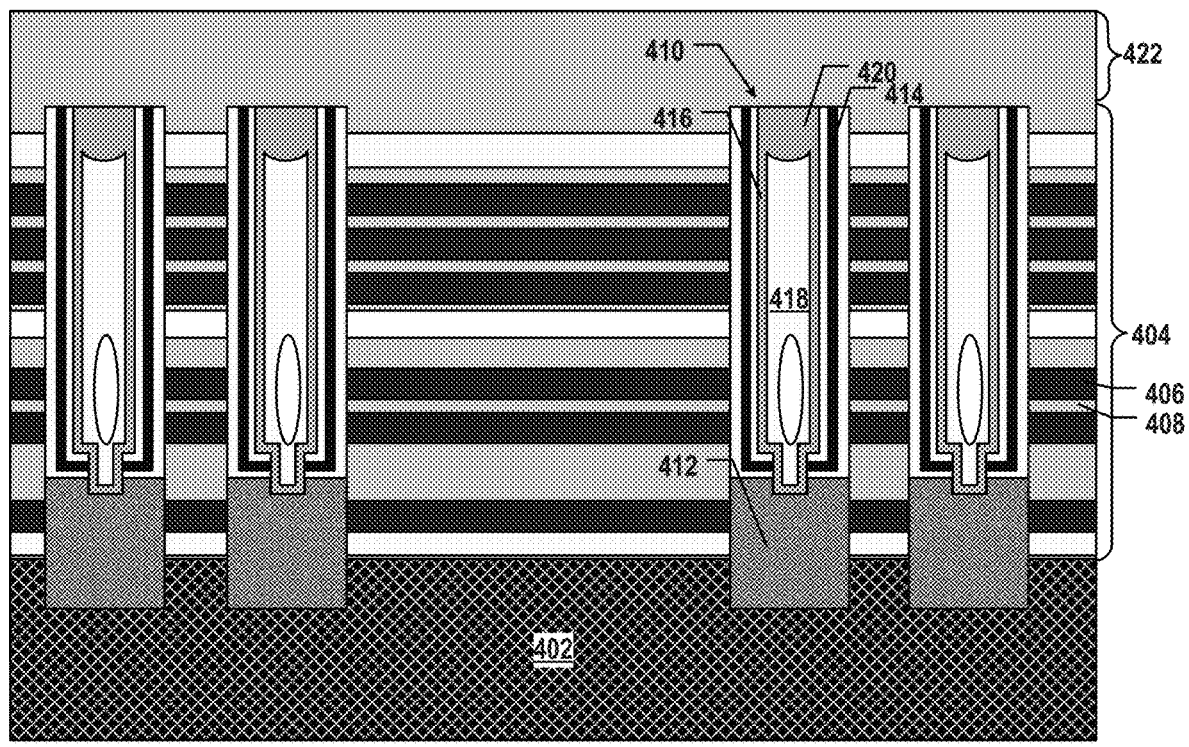
FIGS. 4A-4H illustrate a fabrication process for forming an exemplary 3D memory device, according to some embodiments of the present disclosure.
Figure 4B:
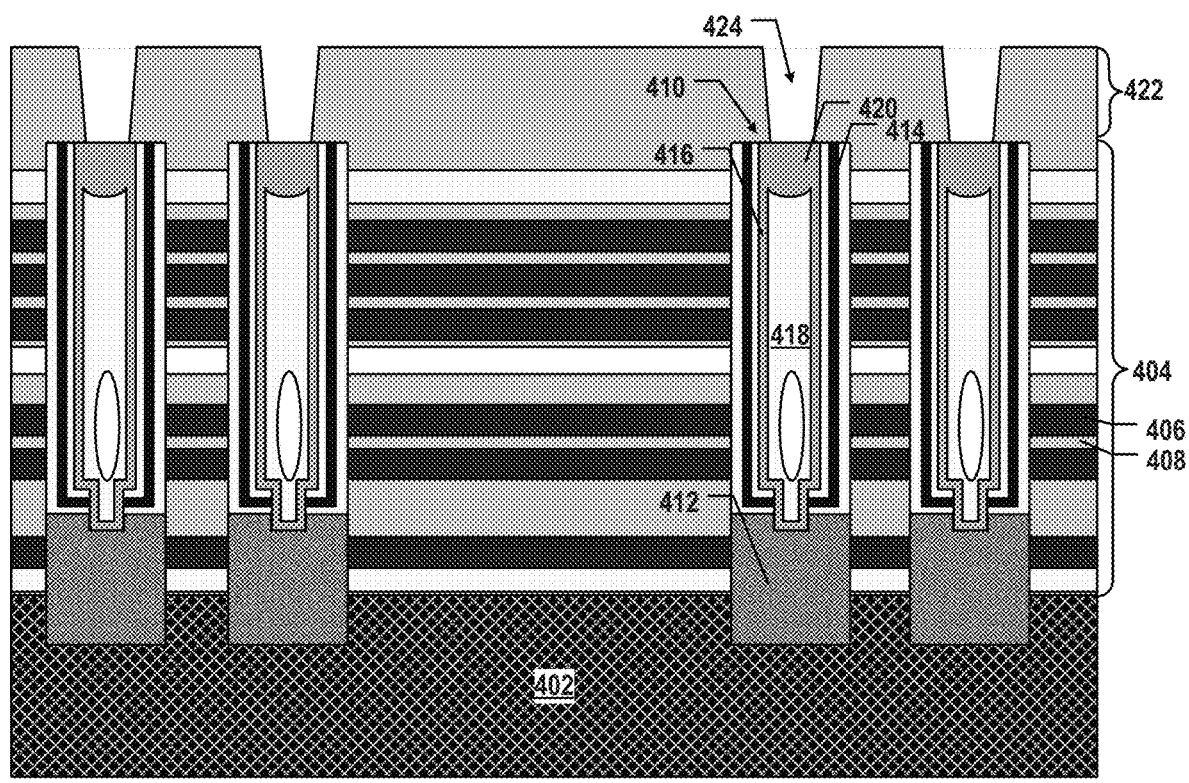

FIGS. 4A-4H illustrate a fabrication process for forming an exemplary 3D memory device, according to some embodiments of the present disclosure. FIG. 5 illustrates a flowchart of a method 500 for forming an exemplary 3D memory device, according to some embodiments of the present disclosure. Examples of the 3D memory device depicted in FIGS. 4A-4H and 5 include 3D memory device 200 depicted in FIG. 2. FIGS. 4A-4H and 5 will be described together. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which a dielectric stack including interleaved sacrificial layers and dielectric layers is formed above a substrate. The substrate can be a silicon substrate. Referring to FIG. 4A, a dielectric stack 404 including a plurality pairs of a sacrificial layer 406 and a dielectric layer 408 is formed above a silicon substrate 402. Dielectric stack 404 includes interleaved sacrificial layers 406 and dielectric layers 408, according to some embodiments. Dielectric layers 408 and sacrificial layers 406 can be alternatingly deposited on silicon substrate 402 to form dielectric stack 404. In some embodiments, each dielectric layer 408 includes a layer of silicon oxide, and each sacrificial layer 406 includes a layer of silicon nitride. That is, a plurality of silicon nitride layers and a plurality of silicon oxide layers can be alternatingly deposited above silicon substrate 402 to form dielectric stack 404. Dielectric stack 404 can be formed by one or more thin film deposition processes including, but not limited to, chemical vapor deposition (CVD), physical vapor deposition (PVD), atomic layer deposition (ALD), or any combination thereof.

Method 500 proceeds to operation 504, as illustrated in FIG. 5, in which a channel structure extending vertically through the dielectric stack is formed. In some embodiments, to form the channel structure, a channel hole extending vertically through the dielectric stack is formed, a memory film and a semiconductor channel are subsequently formed over a sidewall of the channel hole, and a channel plug is formed above and in contact with the semiconductor channel.

As illustrated in FIG. 4A, a channel hole is an opening extending vertically through dielectric stack 404. In some embodiments, a plurality of openings are formed through dielectric stack 404 such that each opening becomes the location for growing an individual channel structure 410 in the later process. In some embodiments, fabrication processes for forming the channel hole of channel structure 410 include wet etching and/or dry etching, such as deep-ion reactive etching (DRIE). In some embodiments, the channel hole of channel structure 410 extends further through the top portion of silicon substrate 402. The etching process through dielectric stack 404 may not stop at the top surface of silicon substrate 402 and may continue to etch part of silicon substrate 402. As illustrated in FIG. 4A, a semiconductor plug 412 can be formed by filling the bottom portion of the channel hole with single-crystal silicon epitaxially grown from silicon substrate 402 in any suitable directions (e.g., from the bottom surface and/or side surface). The fabrication processes for epitaxially growing semiconductor plug 412 can include, but not limited to, vapor-phase epitaxy (VPE), liquid-phase epitaxy (LPE), molecular-beam epitaxy (MPE), or any combinations thereof.

As illustrated in FIG. 4A, a memory film 414 (including a blocking layer, a storage layer, and a tunneling layer) and a semiconductor channel 416 are formed along the sidewall of the channel hole of channel structure 410 and above semiconductor plug 412. In some embodiments, memory film 414 is first deposited along the sidewall of the channel hole and above semiconductor plug 412, and semiconductor channel 416 is then deposited over memory film 414. The blocking layer, storage layer, and tunneling layer can be subsequently deposited in this order using one or more thin film deposition processes, such as ALD, CVD, PVD, any other suitable processes, or any combination thereof, to form memory film 414. Semiconductor channel 416 can then be formed by depositing polysilicon on the tunneling layer using one or more thin film deposition processes, such as ALD, CVD, PVD, any other suitable processes, or any combination thereof. Semiconductor channel 416 can be in contact with semiconductor plug 412 using, for example, a SONO punch process. In some embodiments, semiconductor channel 416 is deposited in the channel hole without completely filling the channel hole. As illustrated in FIG. 4A, a capping layer 418, such as a silicon oxide layer, is formed in the channel hole to fully or partially fill the remaining space of the channel hole using one or more thin film deposition processes, such as CVD, PVD, ALD, electroplating, electroless plating, or any combination thereof.

As illustrated in FIG. 4A, a channel plug 420 is formed in the top portion of the channel hole of channel structure 410. In some embodiments, parts of memory film 414, semiconductor channel 416, and capping layer 418 that are on the top surface of dielectric stack 404 are removed and planarized by CMP, wet etching and/or dry etching. A recess then can be formed in the top portion of the channel hole by wet etching and/or drying etching parts of semiconductor channel 416 and capping layer 418 in the top portion of the channel hole. Channel plug 420 then can be formed by depositing semiconductor materials, such as polysilicon, and/or metals, such as tungsten, into the recess by one or more thin film deposition processes, such as CVD, PVD, ALD, electroplating, electroless plating, or any combination thereof. Channel structure 410 is thereby formed through dielectric stack 404.

Method 500 proceeds to operation 506, as illustrated in FIG. 5, in which a sacrificial plug is formed above and in contact with the channel structure. In some embodiments, to form the sacrificial plug, a local dielectric layer is formed on the dielectric stack, a local contact hole is etched through the local dielectric layer to expose the channel structure, and a sacrificial material that is different from a material of the channel plug is deposited into the local contact hole. The sacrificial material can include silicon nitride. Different from existing methods for forming 3D memory devices (e.g., 3D memory device 100 in FIG. 1) in which the formation of the local contact hole starts after the gate replacement and the formation of the slit structure, method 500 forms the local contact hole prior to the gate replacement and the formation of the slit structure to reduce the chance of misalignment due to wafer local stress.

As illustrated in FIG. 4A, a dielectric layer 422 is formed on dielectric stack 404. Dielectric layer 422 can be formed by depositing dielectric materials, such as silicon oxide and/or silicon nitride, using one or more thin film deposition processes, such as CVD, PVD, ALD, or any combination thereof, on top of the top surface of dielectric stack 404. As illustrated in FIG. 4B, local contact holes 424 are etched through dielectric layer 422 stopping at the upper ends of channel plugs 420 of channel structures 410 to expose the upper ends of channel plugs 420. The etching process can include wet etching and/or dry etching (e.g., DRIE). Channel local contact holes can be patterned by an etching mask (e.g., photoresist) using photolithography, such that each local contact hole 424 is aligned with a respective channel structure 410.

Figure 4C:
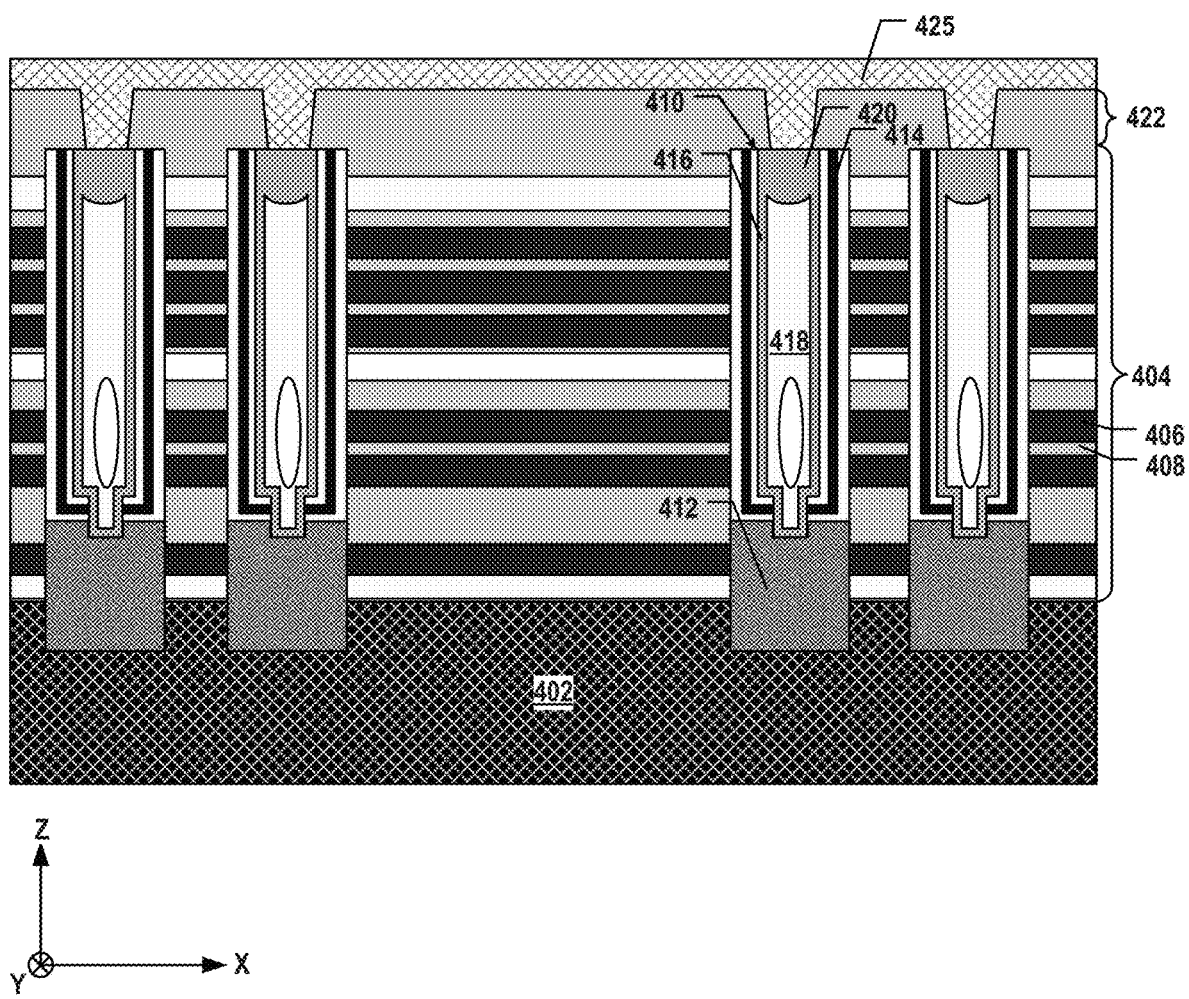
Figure 4D:
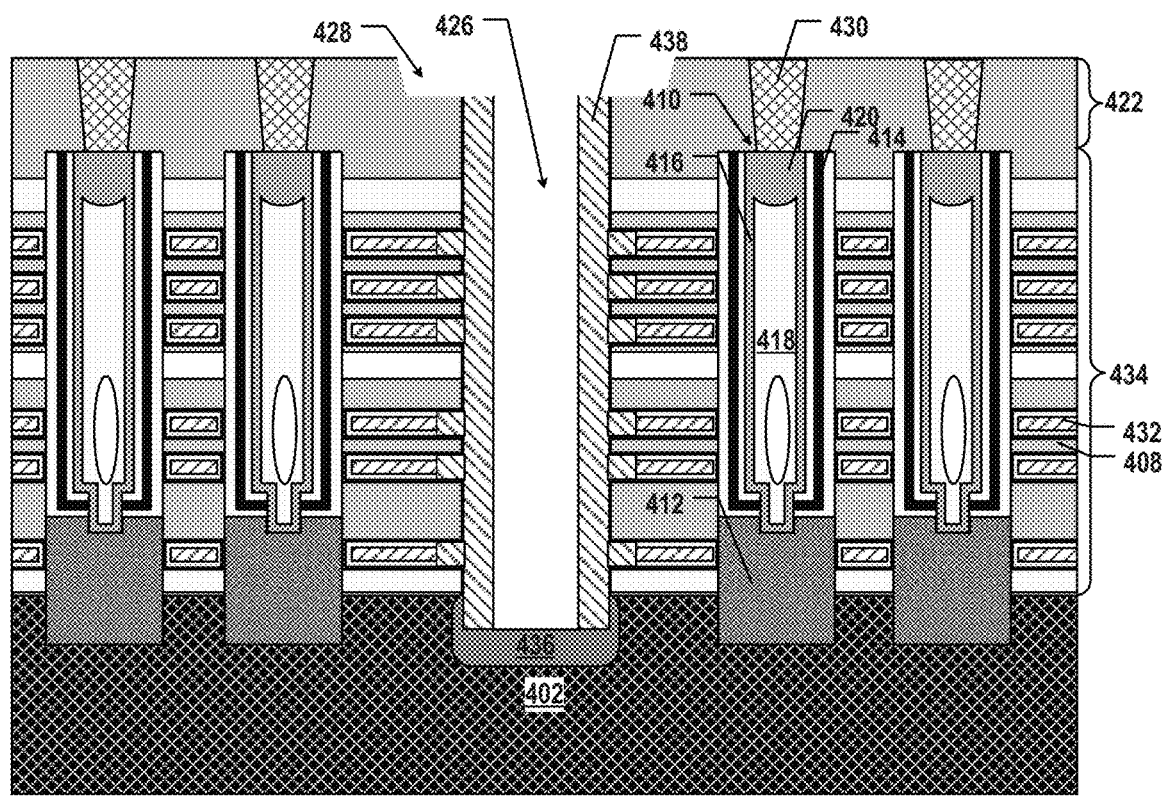
Figure 5:
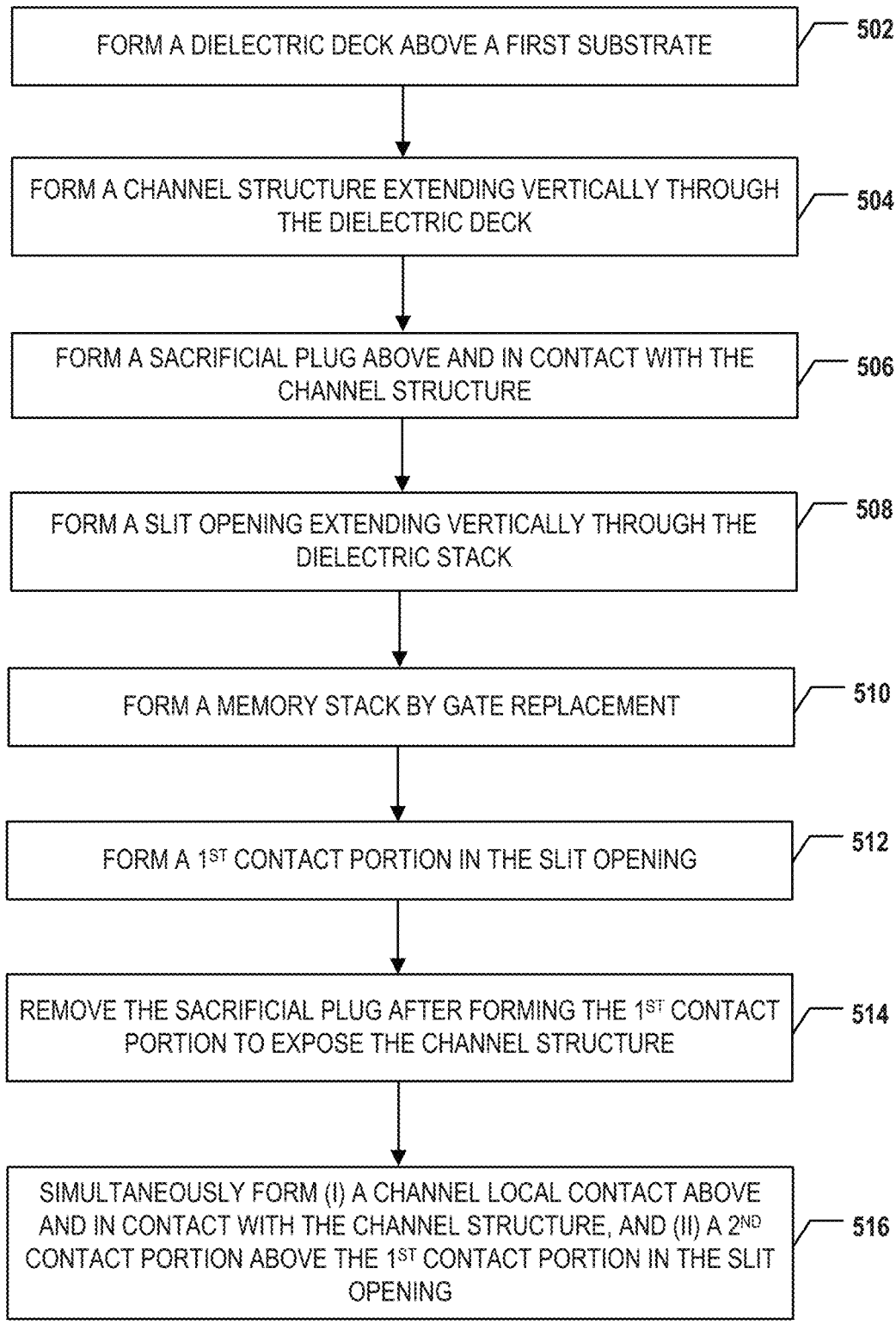
FIG. 5 illustrates a flowchart of a method for forming an exemplary 3D memory device, according to some embodiments of the present disclosure.

As illustrated in FIG. 4C, a sacrificial material 425 that is different from a material of channel plugs 420 is deposited into local contact holes 424. Sacrificial material 425 can include any suitable material other than the material included in channel plugs 420 of channel structures 410 as sacrificial material 425 serves as the protective material of channel plugs 420 in the later processes. In some embodi-ments, channel plugs 420 include polysilicon, and sacrificial material 425 can include any suitable material other than polysilicon. For example, sacrificial material 425 may include silicon nitride. As illustrated in FIG. 4D, a CMP process can be performed to remove the excess sacrificial material 425 and planarize the top surface of dielectric layer 422 to form sacrificial plugs 430. Each sacrificial plug 430 can be above and in contact with a respective channel structure 410 to protect channel plug 420 of respective channel structure 410. Sacrificial plugs 430 are to be removed in the later processes when channel plugs 420 no longer need to be protected. It is understood that in some embodiments in which sacrificial plug 430 includes silicon nitride, a tetraethyl orthosilicate (TEOS) may be formed on sacrificial plugs 430 to protect sacrificial plugs 430.

Method 500 proceeds to operation 508, as illustrated in FIG. 5, in which a slit opening extending vertically through the dielectric stack is formed. In some embodiments, to form the slit opening, the slit opening extending vertically through the local dielectric layer and the dielectric stack is etched, and a top portion of the slit opening is enlarged.

As illustrated in FIG. 4D, a slit opening 426 is etched through dielectric layer 422 as well as interleaved sacrificial layers 406 and dielectric layers 408 (e.g., silicon nitride layers and silicon oxide layers) of dielectric stack 404 (shown in FIG. 4C) to reach silicon substrate 402. The etching process can include one or more cycles of wet etching and/or dry etching (e.g., DRIE). As illustrated in FIG. 4D, the top portion 428 of slit opening 426 can be enlarged to form a "dishing" profile at the upper end of slit opening 426, for example, by further etching away part of dielectric layer 422 surrounding the upper end of slit opening 426. The "dishing" profile of top portion 428 of slit opening 426 can help the deposition of materials into slit opening 426 in the later processes.

Method 500 proceeds to operation 510, as illustrated in FIG. 5, in which a memory stack including interleaved conductive layers and the dielectric layers is formed by replacing, through the slit opening, the sacrificial layers with the conductive layers (i.e., the so-called "gate replacement" process). As illustrated in FIG. 4D, sacrificial layers 406 (shown in FIG. 4C) are replaced with conductive layers 432, and a memory stack 434 including interleaved conductive layers 432 and dielectric layers 408 is thereby formed.

In some embodiments, lateral recesses (not shown) are first formed by removing sacrificial layers 406 through slit opening 426. In some embodiments, sacrificial layers 406 are removed by applying etching solutions through slit opening 426, such that sacrificial layers 406 are removed, creating the lateral recesses interleaved between dielectric layers 408. The etching solutions can include any suitable etchants that etch sacrificial layers 406 selective to dielectric layers 408. As illustrated in FIG. 4D, conductive layers 432 are deposited into the lateral recesses through slit opening 426. In some embodiments, gate dielectric layers are deposited into the lateral recesses prior to conductive layers 432, such that conductive layers 432 are deposited on the gate dielectric layers. Conductive layers 432, such as metal layers, can be deposited using one or more thin film deposition processes, such as ALD, CVD, PVD, any other suitable processes, or any combination thereof.

Method 500 proceeds to operation 512, as illustrated in FIG. 5, in which a first contact portion is formed in the slit opening. In some embodiments, to form the first contact portion, a spacer is formed over a sidewall of the slit opening, a first contact material is deposited over the spacer in the slit opening, and the first contact material is etched back in the slit opening, such that an upper end of the first contact portion is below the top portion of the slit opening. The first contact material can include polysilicon.

As illustrated in FIG. 4D, a doped region 436 can be first formed at the lower end of slit opening 426 (in silicon substrate 402), and a spacer 438 then can be formed over the sidewall of slit opening 426. Doped region 436 can be formed by ion implantation and/or thermal diffusion to dope P-type or N-type dopants into part of silicon substrate 402 exposed through slit opening 426. In some embodiments, etch-back recesses are formed in each conductive layer 432 abutting the sidewall of slit opening 426. Etch-back recesses can be etched-back using wet etching and/or dry etching processes through slit opening 426. Spacer 438 including one or more dielectric layers, such as silicon oxide and silicon nitride, is deposited into the etch-back recesses and along the sidewall of slit opening 426 using one or more thin film deposition processes, such as ALD, CVD, PVD, any other suitable processes, or any combination thereof, according to some embodiments.

Figure 4E:
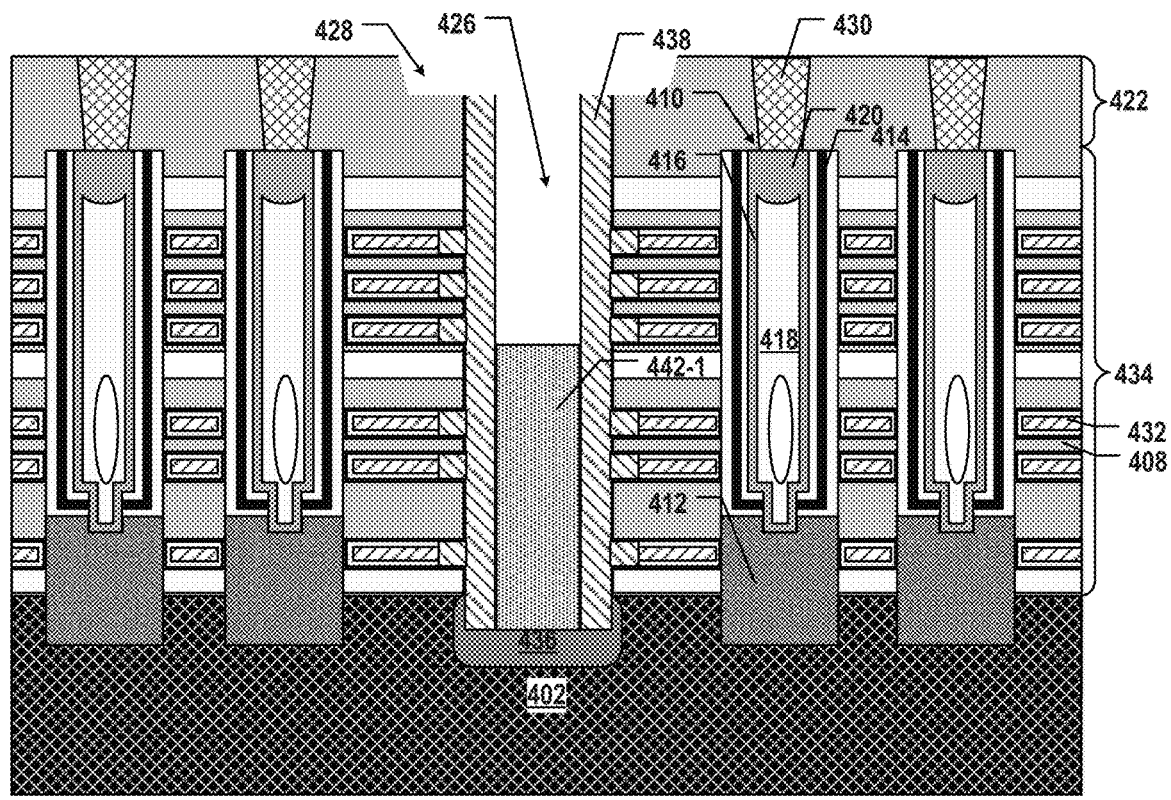

As illustrated in FIG. 4E, a lower contact portion 442-1 in contact with doped region 436 is formed in the bottom portion of silt opening 426. In some embodiments, a contact material including, for example, polysilicon, is deposited over spacer 438 into slit opening 426. As described above, the "dishing" profile of top portion 428 of slit opening 426 can help the deposition of the contact material into slit opening 426, for example, with fewer voids and seams. In some embodiments, an etch-back process is performed to remove part of the contact material in the top portion of slit opening 426, leaving lower contact portion 442-1 in the bottom portion of slit opening 426 (e.g., the upper end of lower contact portion 442-1 is below the top portion of slit opening 426). For example, polysilicon may be etched back using wet etching and/or dry etching. Sacrificial plugs 430 (e.g., having silicon nitride) can thus protect channel plugs 420 having polysilicon during the etching-back process when forming lower contact portion 442-1 in slit opening 426.

Figure 4F:
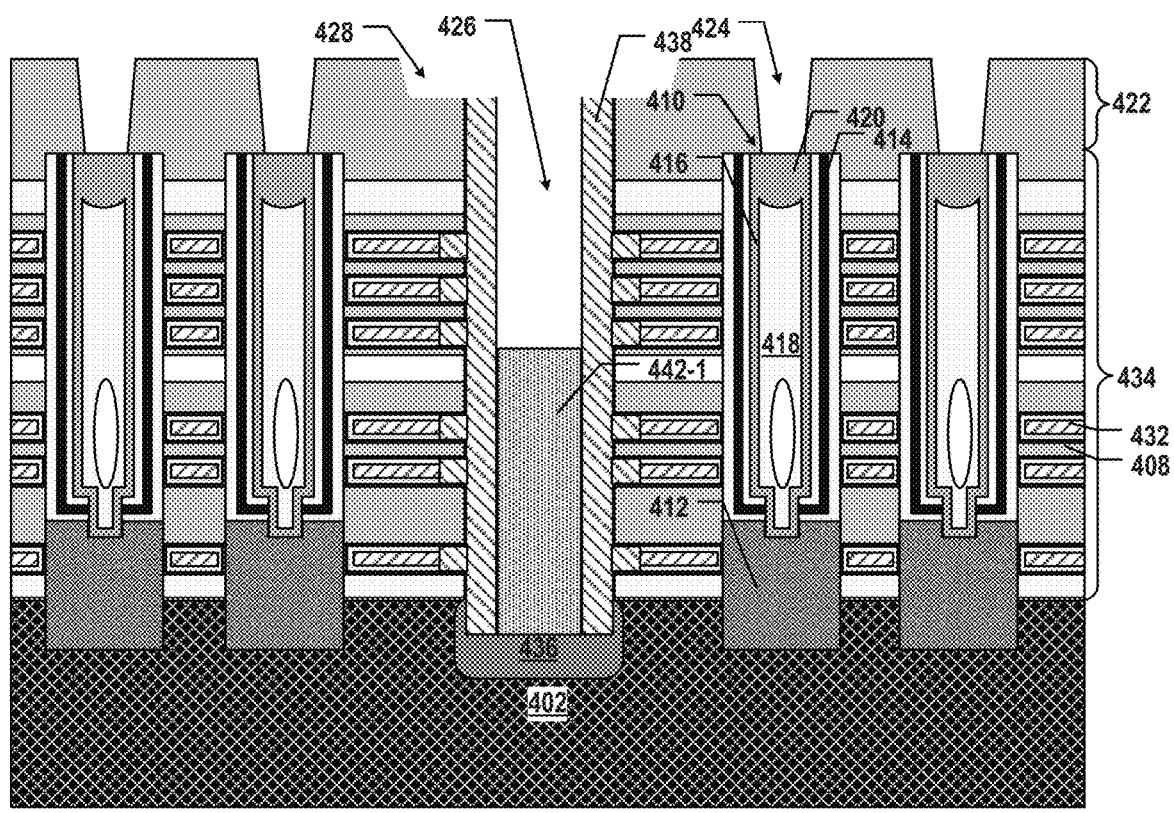

Method 500 proceeds to operation 514, as illustrated in FIG. 5, in which the sacrificial plug is removed after forming the first contact portion to expose the channel structure. As illustrated in FIG. 4F, sacrificial plugs 430 are removed after the formation of lower contact portion 442-1 in slit opening 426 to expose channel structures 410. In some embodiments, sacrificial plugs 430 are etched away using wet etching and/or drying etching, leaving local contact holes 424 to expose channel plugs 420 at the upper ends of channel structures 410.

Method 500 proceeds to operation 516, as illustrated in FIG. 5, in which a channel local contact above and in contact with the channel structure, and a second contact portion above the first contact portion in the slit opening are simultaneously formed. In some embodiments, to simultaneously form the channel local contact and the second contact portion, a second contact material is simultaneously deposited into the local contact hole and the slit opening, and the deposited second contact material is planarized, such that an upper end of the channel local contact is flush with an upper end of the second contact portion of the slit structure. The second contact material can include tungsten.

Figure 4G:
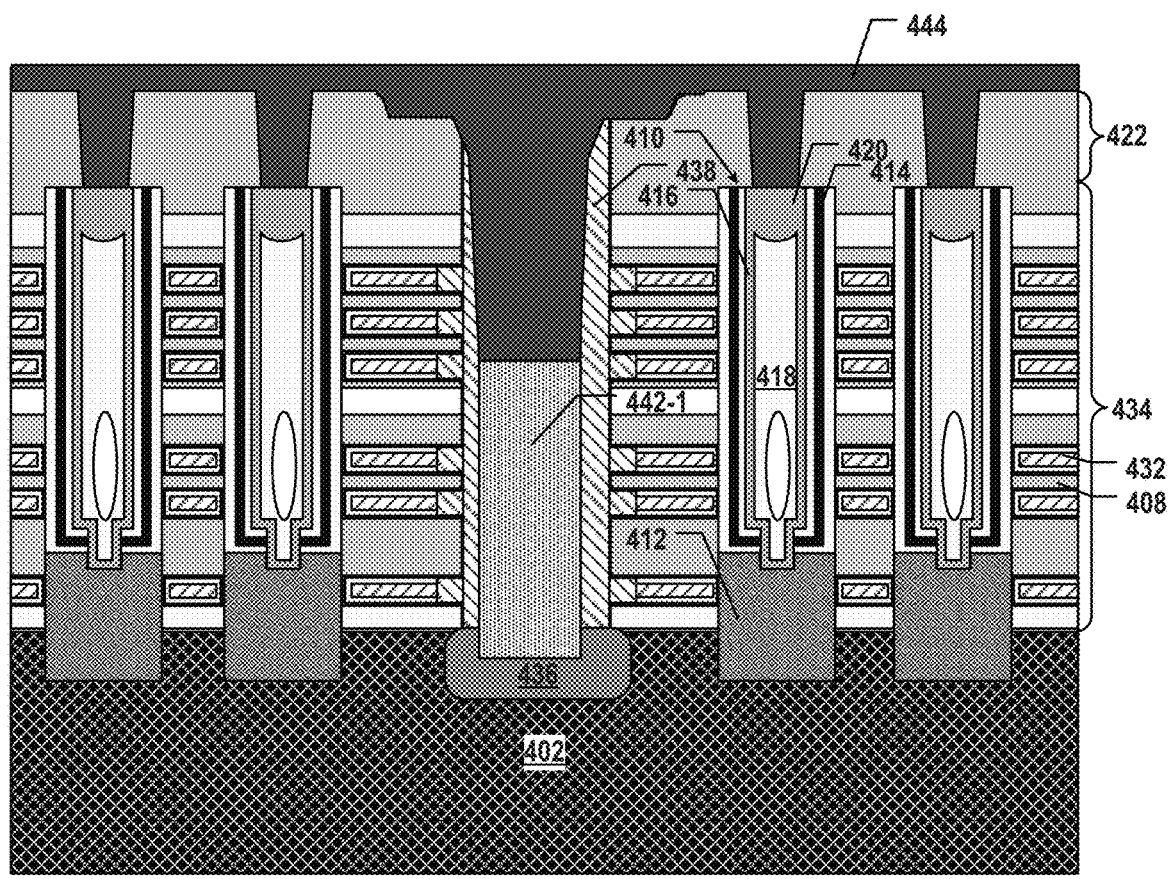
Figure 4H:
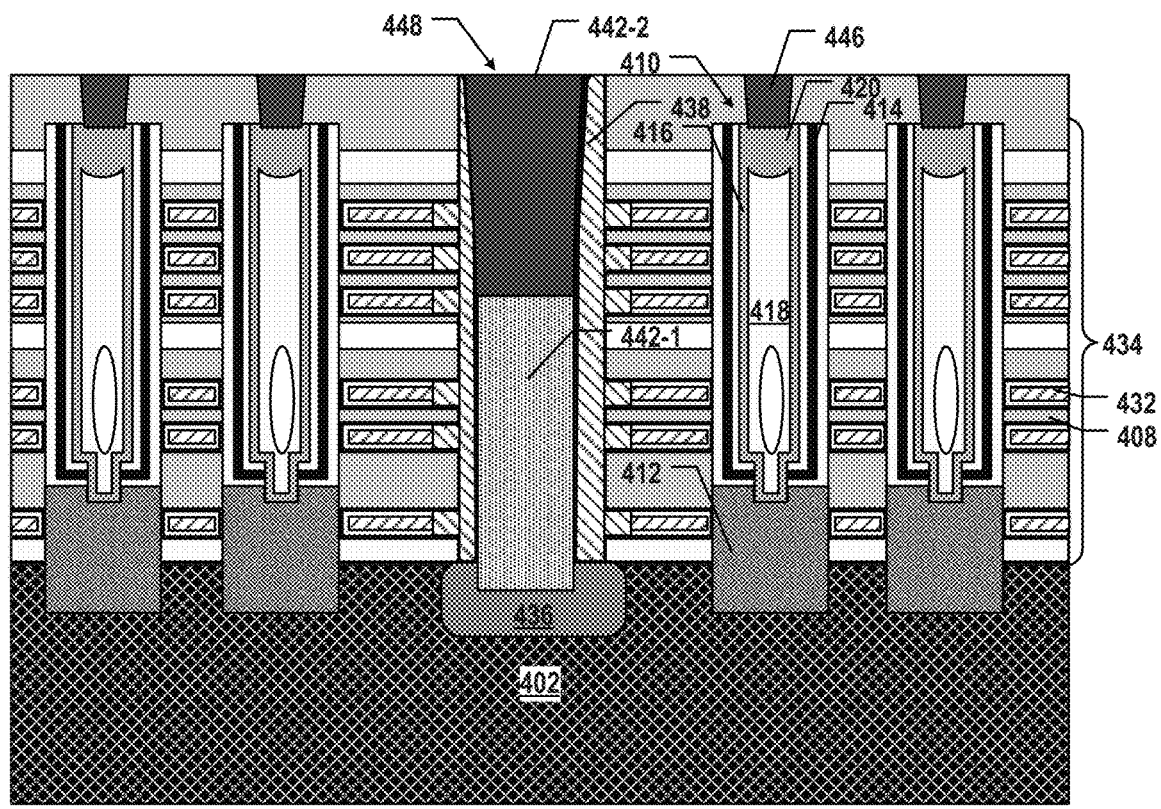

As illustrated in FIG. 4G, a contact material 444 (e.g., tungsten) is simultaneously deposited into local contact hole 424 and the remaining space of slit opening 426 (shown in FIG. 4G) in the same deposition step. The deposition process can include thin film deposition processes, such as ALD, CVD, PVD, any other suitable processes, or any combination thereof. As illustrated in FIG. 4H, a CMP process can be performed to remove the excess contact material 444 and planarize the top surface of contact material 444 (shown in FIG. 4G). The CMP process can become feasible due to the large contact material pattern (e.g., tungsten patterns) in the same plane. As a result, channel local contacts 446 are formed above and in contact with channel structures 410, respectively, and upper contact portion 442-2 is formed above lower contact portion 442-1, as shown in FIG. 4H. A slit structure 448 including spacer 438, lower contact portion 442-1, and upper contact portion 442-2 are thereby formed. The upper ends of channel local contacts 446 and upper contact portion 442-2 are flushed with one another after the same planarization process, according to some embodiments. As shown in FIG. 4H, the CMP process can trim the "dishing" profile at the upper end of upper contact portion 442-2 as described above in detail. That is, the relatively large patterns of contact material 444 (shown in FIG. 4G) allows the CMP process to go further to remove excess contact material 444 that exceeds the boundary of spacer 438 in the plan view, according to some embodiment.

According to one aspect of the present disclosure, a 3D memory device includes a substrate, a memory stack, a channel structure, a channel local contact, and a slit structure. The memory stack includes interleaved conductive layers and dielectric layers above the substrate. The channel structure extends vertically through the memory stack. The channel local contact is above and in contact with the channel structure. The slit structure extends vertically through the memory stack. The slit structure includes a contact including a first contact portion and a second contact portion above the first contact portion and having a different material of the first contact portion. An upper end of the second contact portion of the slit structure is flush with an upper end of the channel local contact.

In some embodiments, the second contact portion of the slit structure and the channel local contact include a same conductive material. In some embodiments, the first contact portion of the slit structure includes polysilicon, and the second contact portion of the slit structure and the channel local contact include a same metal. The metal can include tungsten.

In some embodiments, the slit structure includes a spacer laterally between the contact of the slit structure and the conductive layers of the memory stack.

In some embodiments, the upper end of the second contact portion of the slit structure does not exceed a boundary of the spacer in a plan view.

In some embodiments, a diameter of the upper end of the second contact portion is not greater than an outer diameter of the spacer.

In some embodiments, the diameter of the upper end of the second contact portion is greater than a diameter of the channel local contact.

In some embodiments, the channel structure comprises a semiconductor channel and a memory film.

In some embodiments, the channel structure comprises a channel plug in a top portion of the channel structure and in contact with the channel local contact.

According to another aspect of the present disclosure, a 3D memory device includes a substrate, a memory stack, a channel structure, a channel local contact, and a slit structure. The memory stack includes interleaved conductive layers and dielectric layers above the substrate. The channel structure extends vertically through the memory stack. The channel local contact is above and in contact with the channel structure. The slit structure extends vertically through the memory stack. The slit structure includes a spacer and a contact including a first contact portion and a second contact portion above the first contact portion and having a different material of the first contact portion. A diameter of an upper end of the second contact portion is greater than a diameter of an upper end of the first contact portion and is not greater than an outer diameter of the spacer.

In some embodiments, the upper end of the second contact portion of the slit structure is flush with an upper end of the channel local contact.

In some embodiments, the second contact portion of the slit structure and the channel local contact include a same conductive material. In some embodiments, the first contact portion of the slit structure includes polysilicon, and the second contact portion of the slit structure and the channel local contact include a same metal. The metal can include tungsten.

In some embodiments, the diameter of the upper end of the second contact portion is greater than a diameter of the channel local contact.

In some embodiments, the channel structure comprises a semiconductor channel and a memory film.

In some embodiments, the channel structure comprises a channel plug in a top of the channel structure and in contact with the channel local contact.

According to still another aspect of the present disclosure, a method for forming a 3D memory device is disclosed. A channel structure extending vertically through a dielectric stack including interleaved sacrificial layers and dielectric layers above a substrate is formed. A sacrificial plug above and in contact with the channel structure is formed. A slit opening extending vertically through the dielectric stack is formed. A memory stack including interleaved conductive layers and the dielectric layers is formed by replacing, through the slit opening, the sacrificial layers with the conductive layers. A first contact portion is formed in the slit opening. The sacrificial plug is removed after forming the first contact portion to expose the channel structure. A channel local contact above and in contact with the channel structure, and a second contact portion above the first contact portion in the slit opening are simultaneously formed.

In some embodiments, to form the channel structure, a memory film and a semiconductor channel are subsequently formed over a sidewall of the channel hole, and a channel plug is formed above and in contact with the semiconductor channel.

In some embodiments, to form the sacrificial plug, a local dielectric layer is formed on the dielectric stack, a local contact hole is etched through the local dielectric layer to expose the channel structure, and a sacrificial material that is different from a material of the channel plug is deposited into the local contact hole. The sacrificial material can include silicon nitride.

In some embodiments, to form the slit opening, the slit opening extending vertically through the local dielectric layer and the dielectric stack is etched, and a top portion of the slit opening is enlarged.

In some embodiments, to form the first contact portion in the slit opening, a spacer is formed over a sidewall of the slit opening, a first contact material is deposited over the spacer in the slit opening, and the first contact material in the slit opening is etched back, such that an upper end of the first contact portion is below the top portion of the slit opening. The first contact material can include polysilicon.

In some embodiments, to simultaneously form the channel local contact and the second contact portion, a second contact material is simultaneously deposited into the local contact hole and the slit opening, and the deposited second contact material is planarized, such that an upper end of the channel local contact is flush with an upper end of the second contact portion of the slit structure. The second contact material can include tungsten.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a substrate;
   a memory stack comprising interleaved conductive layers and dielectric layers above the substrate;
   a plurality of channel structures extending vertically through the memory stack;
   a plurality of channel local contacts each of which is above and in contact with one of the plurality of channel structures; and
   a slit structure extending vertically through the memory stack and laterally in a bit-line direction, wherein the slit structure separates the memory stack into a plurality of blocks, and wherein each of the plurality of blocks comprise a subset of the plurality of channel structures,
   wherein the slit structure comprises a contact comprising a first contact portion and a second contact portion above the first contact portion and having a different material of the first contact portion,
      wherein an upper end of the second contact portion of the slit structure is coplanar with an upper end of each of the plurality of channel local contacts, and
      wherein the first contact portion of the slit structure comprises polysilicon, and the second contact portion of the slit structure and each of the plurality of channel local contacts comprise a same metal.

2. The 3D memory device of claim 1, wherein
the slit structure comprises a spacer laterally between the contact of the slit structure and the conductive layers of the memory stack; and
the upper end of the second contact portion of the slit structure does not exceed a boundary of the spacer in a plan view.

3. The 3D memory device of claim 2, wherein a diameter of the upper end of the second contact portion is not greater than an outer diameter of the spacer.

4. The 3D memory device of claim 3, wherein the diameter of the upper end of the second contact portion is greater than a diameter of each of the plurality of channel local contacts.

5. The 3D memory device of claim 1, wherein each channel structure of the plurality of channel structures comprises a semiconductor channel, a memory film, and a channel plug in a top portion of the channel structure and in contact with one of the plurality of channel local contacts.

6. The 3D memory device of claim 1, wherein the same metal comprises tungsten.

7. A three-dimensional (3D) memory device, comprising:
a substrate;
a memory stack comprising interleaved conductive layers and dielectric layers above the substrate;
a plurality of channel structures extending vertically through the memory stack;
a plurality of channel local contacts each located above and in contact with one of the plurality of channel structures; and
a slit structure extending vertically through the memory stack and laterally in a bit-line direction, wherein the slit structure separates the memory stack into a plurality of blocks, and wherein each of the plurality of blocks comprise a subset of the plurality of channel structures,
wherein the slit structure comprises a spacer and a contact comprising a first contact portion and a second contact portion above the first contact portion and having a different material of the first contact portion,
wherein a diameter of an upper end of the second contact portion is greater than a diameter of an upper end of the first contact portion and is not greater than an outer diameter of the spacer,
wherein the upper end of the second contact portion of the slit structure is coplanar with an upper end of each of the plurality of channel local contacts, and
wherein the second contact portion of the slit structure and each of the plurality of channel local contacts comprise a same conductive material.

8. The 3D memory device of claim 7, wherein the diameter of the upper end of the second contact portion is greater than a diameter of each channel local contact of the plurality of channel local contacts.

9. The 3D memory device of claim 7, wherein the first contact portion of the slit structure comprises polysilicon, and the second contact portion of the slit structure and each of the plurality of channel local contacts comprise a same metal.

10. The 3D memory device of claim 9, wherein the same metal comprises tungsten.

11. The 3D memory device of claim 7, wherein each of the plurality of channel structures comprises a semiconductor channel and a memory film.

12. The 3D memory device of claim 7, wherein each channel structure of the plurality of channel structures comprises a channel plug in a top portion of the channel structure and in contact with its channel local contact.

* * * * *